US012754260B2

(12) United States Patent
Ding et al.

(10) Patent No.: US 12,754,260 B2
(45) Date of Patent: Oct. 6, 2026

(54) MAGNETIC SENSOR ARRAY PROCESSING FOR INTERFERENCE REDUCTION

(71) Applicant: Texas Instruments Incorporated, Dallas, TX (US)

(72) Inventors: Lei Ding, Plano, TX (US); Srinath Mathur Ramaswamy, Murphy, TX (US); Dok Won Lee, Mountain View, CA (US); Steven Howard, Plano, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 17/875,840

(22) Filed: Jul. 28, 2022

(65) Prior Publication Data

US 2023/0052689 A1 Feb. 16, 2023

Related U.S. Application Data

(60) Provisional application No. 63/232,637, filed on Aug. 13, 2021.

(51) Int. Cl.

| | |
|---|---|
| ***G01R 33/07*** | (2006.01) |
| ***G01R 19/02*** | (2006.01) |
| ***H02M 1/00*** | (2006.01) |

(52) U.S. Cl.
CPC ........... *G01R 33/072* (2013.01); *G01R 19/02* (2013.01); *H02M 1/0009* (2021.05)

(58) Field of Classification Search
CPC .... G01R 33/072; G01R 19/02; G01R 15/207; G01R 19/32; G01R 23/02; G01R 35/005; G01R 15/202; G01R 33/0029; G01R 33/0035; G01R 33/0082; G01R 33/0094; H02M 1/0009; H02M 1/0012; H02M 7/44
See application file for complete search history.

(56) References Cited

U.S. PATENT DOCUMENTS

2005/0073293 A1* 4/2005 Hastings .............. G01R 15/202 324/117 H
2005/0192765 A1* 9/2005 Slothers ................... G01D 5/12 702/57
2006/0158268 A1* 7/2006 McCorquodale ........ H03B 5/06 331/34
2009/0001964 A1* 1/2009 Strzalkowski ....... G01R 15/181 324/202

(Continued)

*Primary Examiner* — Alvaro E Fortich
(74) *Attorney, Agent, or Firm* — Zhenhai Fu; Charles F. Koch

(57) ABSTRACT

Current sensing techniques. In an example, a current sensing method includes: generating a first magnetic field measurement; generating a second magnetic field measurement; generating a frequency estimate of a current; calculating a root-mean-square (RMS) value of an estimated amplitude of the current; and generating a temperature estimate of an integrated circuit (IC) configured to perform the method. The method also includes generating a first weighting factor and a second weighting factor based on the frequency estimate, the RMS value, and the temperature estimate, the first weighting factor to control amplification of the first magnetic field measurement and the second weighting factor to control amplification of the second magnetic field measurement.

23 Claims, 8 Drawing Sheets

(56) References Cited

U.S. PATENT DOCUMENTS

| | | | | |
|---|---|---|---|---|
| 2016/0195574 | A1* | 7/2016 | Virtala | G01R 23/15 702/64 |
| 2018/0059148 | A1* | 3/2018 | Geisler | G01R 15/202 |
| 2019/0113550 | A1* | 4/2019 | Hong | G01R 33/0082 |
| 2019/0293689 | A1* | 9/2019 | Lerner | G01R 15/202 |
| 2019/0386206 | A1* | 12/2019 | Schaller | H10N 50/01 |
| 2020/0350831 | A1* | 11/2020 | Aichriedler | G01R 15/202 |

* cited by examiner

MAGNETIC SENSOR ARRAY PROCESSING FOR INTERFERENCE REDUCTION

CROSS-REFERENCE TO RELATED APPLICATION

This application claims the benefit of and priority to U.S. Provisional Patent Application No. 63/232,637 filed Aug. 13, 2021, which is incorporated herein by reference in its entirety.

TECHNICAL FIELD

This description relates to current sensing, and more particularly to techniques for magnetic sensor array processing for interference reduction.

BACKGROUND

Current sensing is used in many applications. Usually, a magnetic sensor is employed to measure the current in a conductor. The sensor comprises a magnetic core which encircles the conductor and provides shielding of magnetic fields generated by neighboring conductors which can otherwise result in undesirable interference. Unfortunately, the magnetic cores add cost, weight, and other mechanical constraints to the system design. Removing the cores, however, can reduce the accuracy of the current measurements due to the interference.

SUMMARY

In an example an integrated circuit (IC) includes: a first sensor configured to generate a first magnetic field measurement; a second sensor configured to generate a second magnetic field measurement; and a weight generation circuit configured to generate a first weighting factor and a second weighting factor based on calibrated coupling coefficients, the first weighting factor to control amplification of the first magnetic field measurement and the second weighting factor to control amplification of the second magnetic field measurement.

In another example, a method of current sensing includes: generating a first magnetic field measurement; generating a second magnetic field measurement; generating a frequency estimate of a current; calculating a root-mean-square (RMS) value of an estimated amplitude of the current; and generating a temperature estimate of an integrated circuit (IC) configured to perform the method. The method also includes generating a first weighting factor and a second weighting factor based on the frequency estimate, the RMS value, and the temperature estimate, the first weighting factor to control amplification of the first magnetic field measurement and the second weighting factor to control amplification of the second magnetic field measurement.

In another example, a traction inverter system includes: an inverter circuit configured to convert direct current into a first alternating current phase, delivered on a first busbar, and a second alternating current phase, delivered on a second busbar; and a current sensor package configured to estimate amplitude of the first alternating current phase in the first busbar, the current sensor package disposed on the first busbar and comprising an integrated circuit (IC), the IC including: a first sensor configured to generate a first measurement signal of a magnetic field generated by the first busbar; a second sensor configured to generate a second measurement signal of the magnetic field generated by the first busbar; and a weight generation circuit configured to generate a first weighting factor and a second weighting factor based on calibrated coupling coefficients, the first weighting factor to control amplification of the first measurement signal and the second weighting factor to control amplification of the second measurement signal.

In another example, a device includes: a first sensor having a first output; a second sensor having a second output; a first analog front end (AFE) circuit having a first input, a second input, and a third output, the first input coupled to the first output; a second AFE circuit having a third input, a fourth input, and a fourth output, the third input coupled to the second output; and a weight generation circuit having a fifth input, a sixth input, a seventh input, a fifth output, and a sixth output, the fifth output coupled to the second input of the first AFE to provide a first amplification weighting factor, the sixth output coupled to the fourth input of the second AFE to provide a second amplification weighting factor; wherein the first amplification weighting factor and the second amplification weighting factor are based on the fifth input, the sixth input, and the seventh input, the fifth input providing a frequency measurement of an estimated current flow, the sixth input providing a root-mean-square (RMS) value of the estimated current flow, and the seventh input providing a temperature of the device.

DETAILED DESCRIPTION

Figure 1:
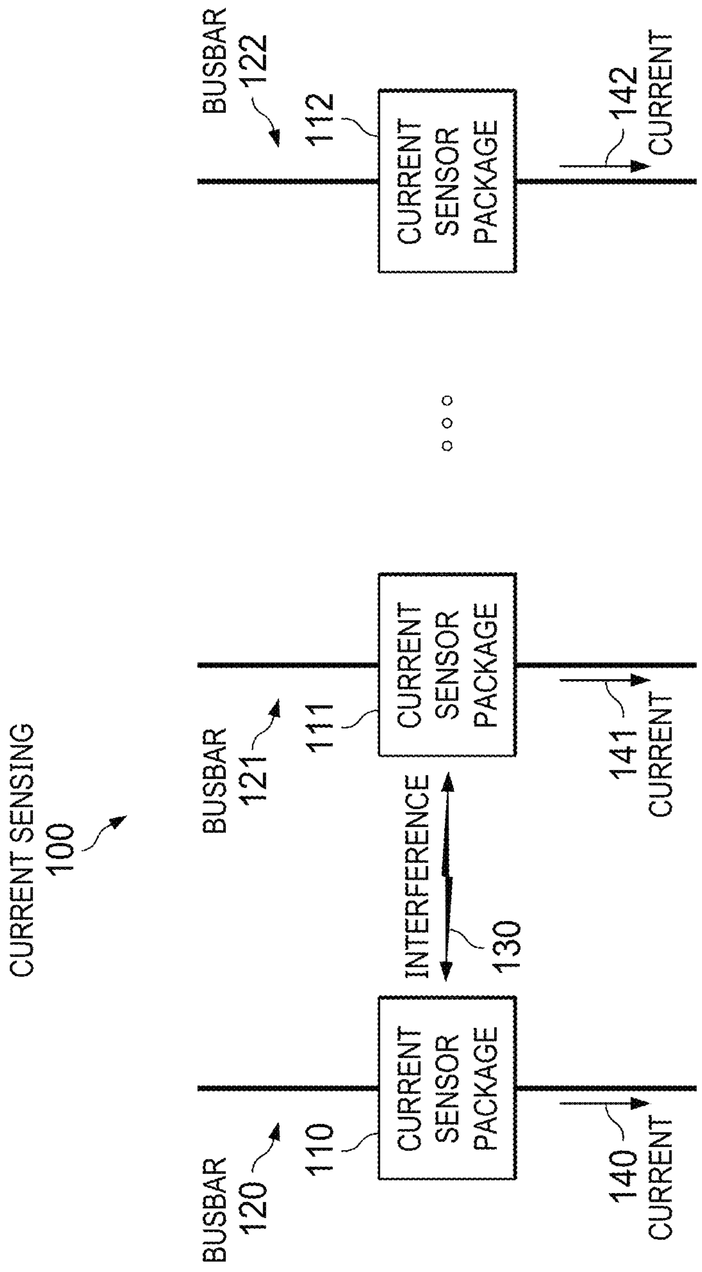
FIG. 1 illustrates current sensing to measure current in busbar conductors, in an example.

Techniques are described herein for using magnetic sensors to estimate current flow in a conductor. The techniques are configured to reduce the effects of magnetic field interference generated from current flow in adjacent conductors, and beneficially eliminate or otherwise reduce the need for shielded magnetic core sensors that encircle the conductors. Shielded magnetic core sensors can be costly and difficult to incorporate in many systems. Moreover, magnetic shielding material of shielded magnetic core sensors can limit linearity, frequency, and saturation of the sensors, which can reduce current estimation accuracy. The techniques described herein are useful in a wide variety of applications, such as traction inverters and other multi-phase power systems where current measurement is required or otherwise useful. More generally, the described techniques are useful for any systems that include multiple conductors that are routed in relative proximity, where magnetic field interference is possible, and for which accurate current measurements are required.

Accordingly, a magnetic sensor array and processing circuitry are described herein, along with a methodology for combining weighted sensor readings to estimate current flow in a conductor with increased accuracy and reduced interference from neighboring conductors. In some embodiments, weighting factors may be predetermined during a calibration process based on calculated coefficients of coupling between the conductors and the sensors. In some example embodiments, the sensors and processing circuitry are implemented as one or more integrated circuits (ICs), also referred to herein as dies, in a current sensor package that can be disposed on a conductor.

The magnetic sensor array may include two or more sensors, each configured to measure a magnetic field associated with a conductor. In an example, a current sensor package comprising a die or IC includes: a first sensor configured to generate a first magnetic field measurement; a second sensor configured to generate a second magnetic field measurement; and a weight generation circuit configured to generate a first weighting factor and a second weighting factor based on calibrated coupling coefficients, the first weighting factor to control amplification of the first magnetic field measurement and the second weighting factor to control amplification of the second magnetic field measurement.

In another example, a method for current sensing includes generating a first magnetic field measurement; generating a second magnetic field measurement; generating a frequency estimate of a current; calculating a root-mean-square (RMS) value of an estimated amplitude of the current; and generating a temperature estimate of an integrated circuit (IC) configured to perform the method. The method also includes generating a first weighting factor and a second weighting factor based on the frequency estimate, the RMS value, and the temperature estimate, the first weighting factor to control amplification of the first magnetic field measurement and the second weighting factor to control amplification of the second magnetic field measurement.

The techniques described herein may provide improved current sensing along with reduced material and manufacturing costs, compared to existing techniques that require shielded magnetic core sensors which increase system cost, weight, and size, making them unsuitable for many applications.

FIG. 1 illustrates current sensing 100 to measure current in busbar conductors. A number of busbars 120, 121, 122 are shown which each conduct current 140, 141, and 142 respectively. The busbars can be any type of conductor including wire, cable, or other conductive material fabricated in any suitable form factor. Current sensor packages 110, 111, and 112 can be any number of integrated circuit packages configured to contain one or more die (e.g., wide body multi-die packages configured with I/O pins or pads that couple to a printed circuit board or substrate), and are shown to be disposed or otherwise placed in close proximity to the respective busbars 120, 121, 122. Any number of busbars and associated current sensor packages may be employed. The current flowing through each busbar generates a magnetic field which can be measured by sensors in the associated current sensor package. If busbars have relatively close proximity to each other, then interference 130 generated by the magnetic field from one busbar can be sensed by the current sensor package of one or more adjacent busbars. But the sensor array and processing techniques described herein help to preserve accuracy of the current estimate for that busbar, notwithstanding such interference 130.

Figure 2:
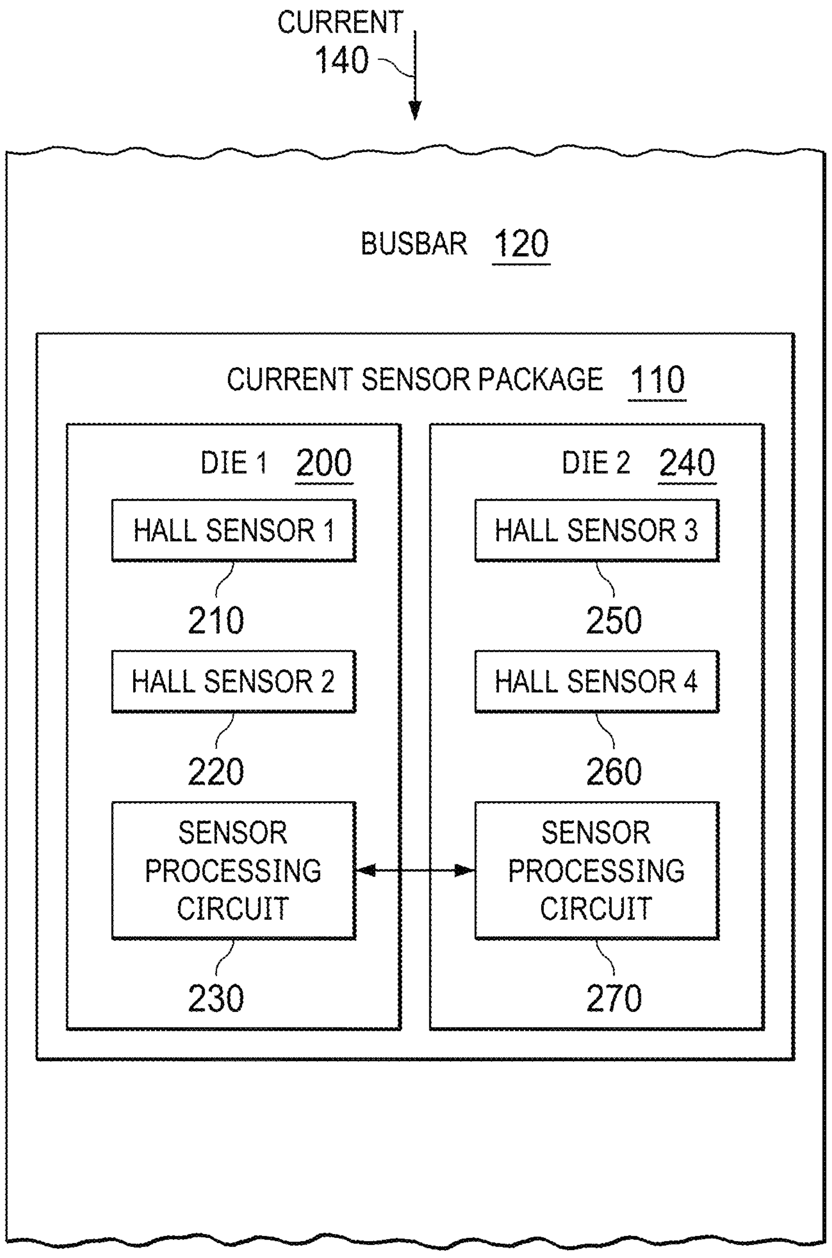
FIG. 2 is a top-level block diagram of the current sensor package of FIG. 1, in an example.

FIG. 2 is a top-level block diagram of the current sensor package 110 of FIG. 1. The package 110 is shown to include two ICs or dies 200 and 240. Die 1 200 is shown to include a first Hall effect sensor 210, a second Hall effect sensor 220, and a first sensor processing circuit 230. Die 2 240 is shown to include a third Hall effect sensor 250, a fourth Hall effect sensor 260, and a second sensor processing circuit 230. The dies and the busbar are not drawn to scale. The sensors are configured to measure magnetic fields which may be generated by the current 140 flowing in busbar 120, and to some extent by the current flowing in other busbars 121 and 122 (e.g., the interference 130). The sensors may be oriented or otherwise configured to sense magnetic fields in different directions (e.g., in the plane of the busbar versus perpendicular to the plane of the busbar).

The operation of the sensors and the sensor processing circuits is described below, but at a high level, the sensor processing circuits 230 and 270 are configured to generate an estimate of the current flow through busbar 120 by calculating a weighted sum of the measurements provided by the sensors 210, 220, 250, and 260. In some embodiments, the weighting factors may be predetermined, for example during a calibration process, to reduce the effect of interference 130 from other busbars. The weighting factors may also be varied based on the frequency and amplitude of the sensor output and on the temperature of the sensor, to further improve accuracy.

In some embodiments, the current sensor package may employ only one die 200. In some other embodiments, the current sensor package may be extended to employ additional dies to provide additional sensors which operate in the same manner as described herein. In some embodiments, additional sensor packages may be employed such that any number of dies can be included in the different sensor packages. In some embodiments, each die may include fewer or more sensors, for example depending on form factor requirements and other design constraints. In some embodiments, the sensors may be configured to sense magnetic fields in any desired direction, including two or more sensors sensing magnetic fields in the same direction.

Figure 3:
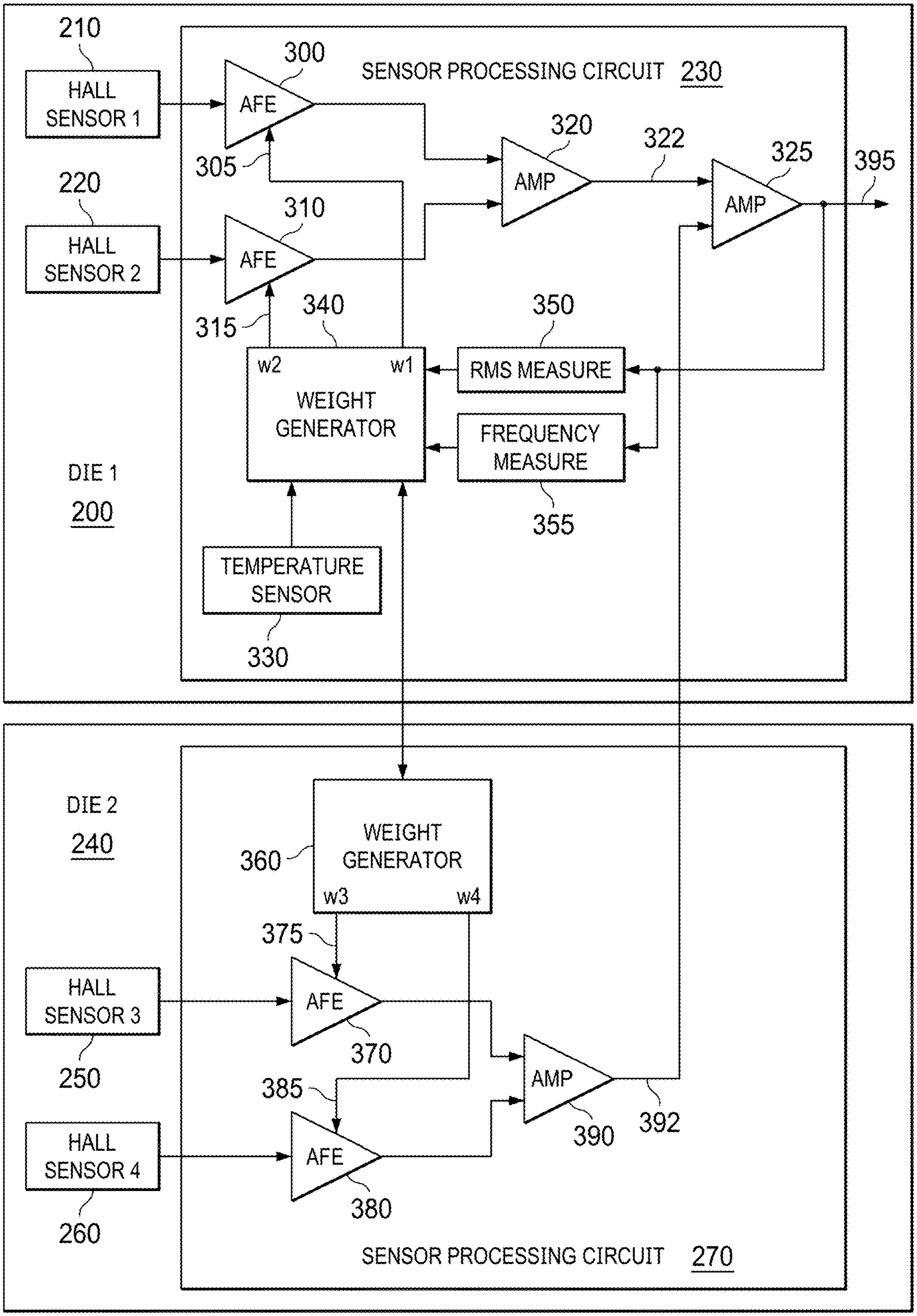
FIG. 3 is a detailed block diagram of the dies of the current sensor package of FIG. 2, in an example.

FIG. 3 is a detailed block diagram of dies 200 and 240 of the current sensor package 110 of FIG. 2. The first die 200 includes the first Hall effect sensor 210, the second Hall effect sensor 220, and the sensor processing circuit 230. The sensor processing circuit 230 includes a first analog front end (AFE) 300, a second AFE 310, summing amplifiers 320 and 325, weight generator 340, RMS measurement circuit 350, frequency measurement circuit 355, and temperature sensor 330.

The first Hall effect sensor 210 is configured to generate a first measurement signal of the magnetic field generated by current flowing through the conductor 120. For example, the measurement signal may be a voltage that is proportional to the magnetic field. The second Hall effect sensor 220 is configured to generate a second measurement signal of the magnetic field generated by the conductor 120. In some embodiments, the first and second sensors may be configured to measure components of the magnetic field that are orthogonal to each other. For example, the first sensor may measure a component of the magnetic field that is in the plane of the busbar while the second sensor may measure a component of the magnetic field that is perpendicular to the plane of the busbar, although other orientations are possible.

AFE 300 includes an amplifier circuit and is configured to amplify the first measurement signal based on a first amplification weighting factor w1 305. Similarly, AFE 310 includes an amplifier circuit and is configured to amplify the second measurement signal based on a second amplification weighting factor w2 315. AFEs 300 and 310 may also provide any other suitable analog front end functionality (e.g., filtering).

Summing amplifier 320 is configured to sum the outputs of AFE 300 and AFE 310 to generate a first component 322 of the estimated current flowing through the conductor.

RMS measurement circuit 350 is configured to generate an RMS value of the estimated amplitude 395 of the current in the conductor.

Frequency measurement circuit 355 is configured to generate a frequency estimate of the estimated current 395.

Temperature sensor 330 is configured to generate a temperature estimate of the die 200.

Weight generator 340 is configured to generate the first weighting factor w1 and the second weighting factor w2 based on the frequency estimate, the RMS value, and the temperature estimate. In some embodiments, the weighting factors may be precalculated during a calibration process, as described below, and retrieved from a lookup table or other memory. In some embodiments, weight generator 340 is also configured to generate weighting factors for AFEs 370 and 380, included in the second die 240, as described below.

Summing amplifier 325 is configured to sum the first component 322 of the estimated current flowing through the conductor with a second component 392, provided by the second die 240, as described below, to generate the estimated current 395 flowing through the conductor.

The second die 240 includes the third Hall effect sensor 250, the fourth Hall effect sensor 260, and the sensor processing circuit 270. The sensor processing circuit 270 includes a third AFE 370, a fourth AFE 380, summing amplifier 390, and weight generator 360.

The third Hall effect sensor 250 is configured to generate a third measurement signal of the magnetic field generated by current flowing through the conductor 120, and the fourth Hall effect sensor 260 is configured to generate a fourth measurement signal of the magnetic field generated by the conductor 120. In some embodiments, the third and fourth sensors may also be configured to make orthogonal measurements, relative to each other, of the magnetic field.

Weight generator 360 is configured to provide the third weighting factor w3 375 and the fourth weighting factor w4 385, for example by communicating with weight generator 340 on die 1 to obtain the weighting factors.

AFE 370 includes an amplifier circuit and is configured to amplify the third measurement signal based on the third weighting factor w3. Similarly, AFE 380 includes an amplifier circuit and is configured to amplify the fourth measurement signal based on a fourth weighting factor w4 385. AFEs 370 and 380 may also provide any other suitable analog front end functionality (e.g., filtering).

Summing amplifier 390 is configured to sum the outputs of AFE 370 and AFE 380 to generate a second component 392 of the estimated current flowing through the conductor, which is provided as input back to amplifier 325 on die 1.

In some embodiments, weight generators 340 and 360 may be implemented as a processor or a finite state machine.

In some embodiments, weight generators 340 and 360 may be configured to provide default weights, for example during initialization of the system prior to the availability of a frequency estimate, RMS value, or temperature estimate. The default weights may be based, in part, on a nominal temperature value and a relatively low frequency (since the traction inverter may initially provide DC or low frequency current at startup).

Figure 4:
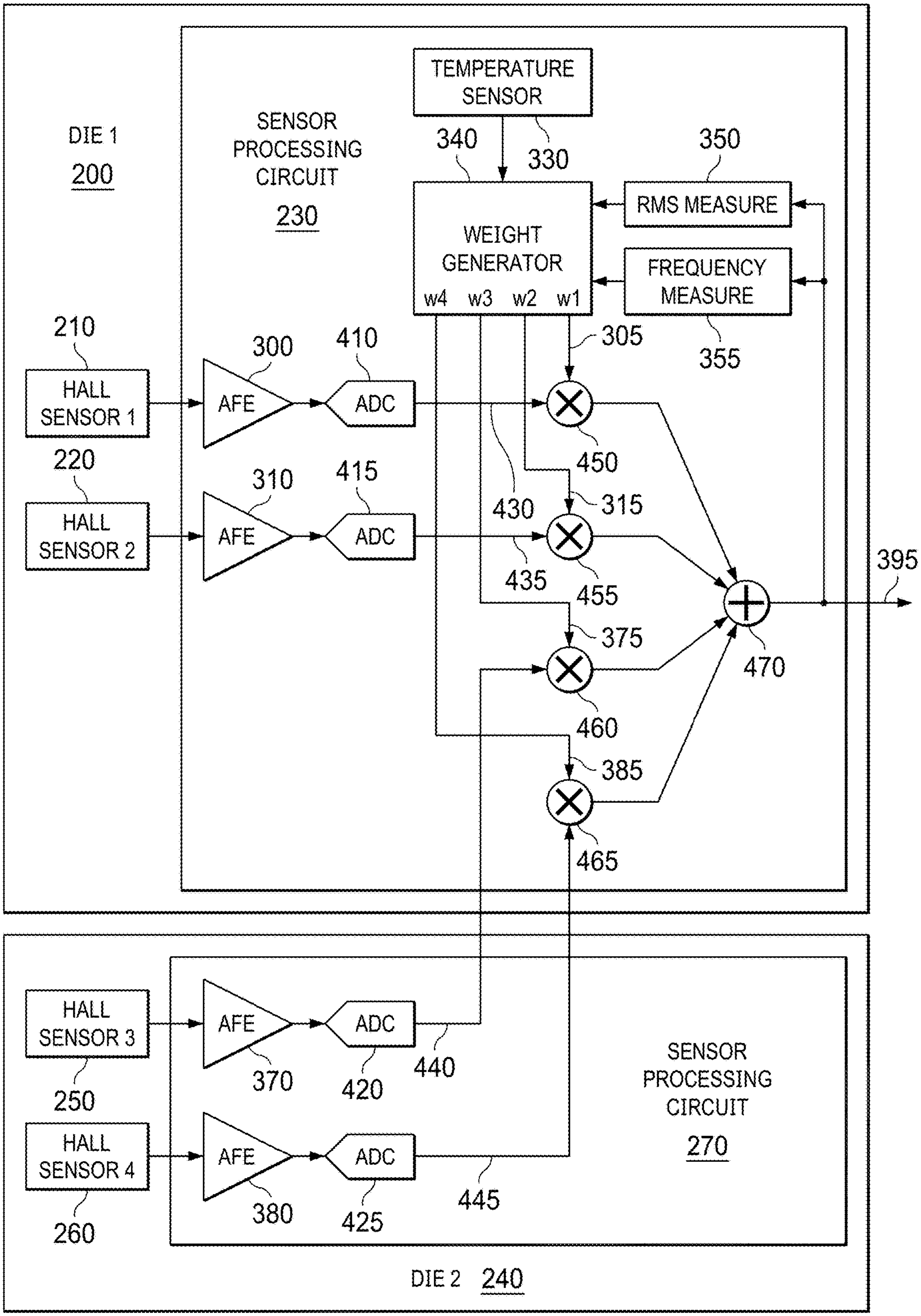
FIG. 4 is a detailed block diagram of the dies of the current sensor package of FIG. 2, in another example.

FIG. 4 is a detailed block diagram of dies 200 and 240 of the current sensor package 110 of FIG. 2 configured in another embodiment. This embodiment is similar to the embodiment described above in connection with FIG. 3, but in this example the weighting factors are applied in the digital domain rather than the analog domain.

The first die 200 includes the first Hall effect sensor 210, the second Hall effect sensor 220, and the sensor processing circuit 230. The sensor processing circuit 230 includes a first AFE 300, a second AFE 310, analog to digital converters (ADCs) 410 and 415, weight generator 340, multipliers 450, 455, 460, and 465, adder 470, RMS measurement circuit 350, frequency measurement circuit 355, and temperature sensor 330.

The second die 240 includes the third Hall effect sensor 250, the fourth Hall effect sensor 260, and the sensor processing circuit 270. The sensor processing circuit 270 includes a third AFE 370, a fourth AFE 380, and ADCs 420 and 425.

Hall effect sensors 210, 220, 250, and 260 operate as described above. AFEs 300, 310, 370, 380 each include an amplifier circuit and are configured to provide amplification and other analog front end functionality (e.g., filtering), however the amplification is not based on the weighting factors (e.g., the amplification may be fixed or otherwise determined based on any suitable requirements).

ADCs 410, 415, 420, and 425 are configured to digitize the analog output of AFEs 300, 310, 370, and 380 to generate digital signals 430, 435, 440, and 445 respectively. In some examples, ADCs 410, 415, 420, and 425 may be included within AFEs 300, 310, 370, and 380, respectively. More generally, the degree of integration of the various components shown in the examples described herein may vary (e.g., where two or more individual components depicted in a given figure are integrated into a single component, or where a single component depicted in a given figure is implemented as two or more individual and separate components that are operatively coupled to one another). In any such cases, a similar overall functionality may be achieved, as variously described herein.

RMS measurement circuit 350, frequency measurement circuit 355, temperature sensor 330, and weight generator 340 operate as described above.

Multiplier 450 is configured to multiply the first digitized signal 430 by the first weighting factor 305. Multiplier 455 is configured to multiply the second digitized signal 435 by the second weighting factor 315. Multiplier 460 is configured to multiply the third digitized signal 440 by the third weighting factor 375. Multiplier 465 is configured to multiply the fourth digitized signal 445 by the fourth weighting factor 385. Summer 470 is configured to sum the outputs of the four multipliers to generate the estimated current 395 flowing through the conductor.

In some other embodiments, the weighting factors 305, 315, 375, and 385 may be routed back to the respective AFEs 300, 310, 370, and 380 to control the gains of those AFEs instead of being used as scale factors for the digital multipliers 450, 455, 460, and 465.

Figure 5:
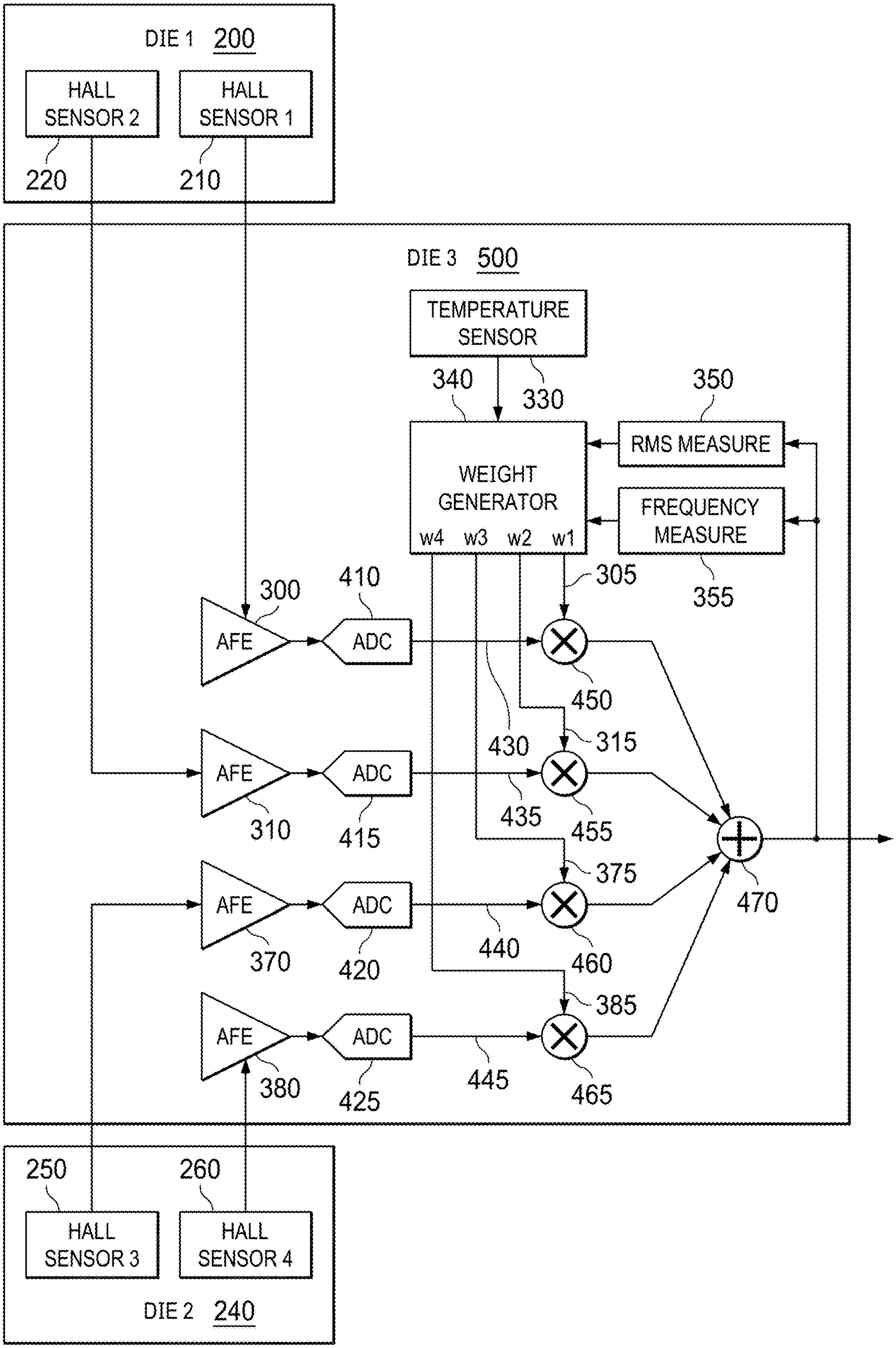
FIG. 5 is a detailed block diagram of the dies of the current sensor package of FIG. 2, in yet another example.

FIG. 5 is a detailed block diagram of the current sensor package 110 of FIG. 2 configured in yet another embodiment. In this embodiment, the distribution of components among the dies is modified. In particular, the first die 200 includes the first and second Hall effect sensors 210 and 220, and the second die 240 includes the third and fourth Hall effect sensors 250 and 260. An additional (third) die 500 is configured to include the remaining circuit components: AFEs 300, 310, 370, 380; ADCs 410, 415, 420, 425; weight generator 340; multipliers 450, 455, 460, 465; summer 470; temperature sensor 330; RMS measurement circuit 350; and frequency measurement circuit 355. Although the distribution of components is changed, the operation of the components remains the same as described above.

Figure 6:
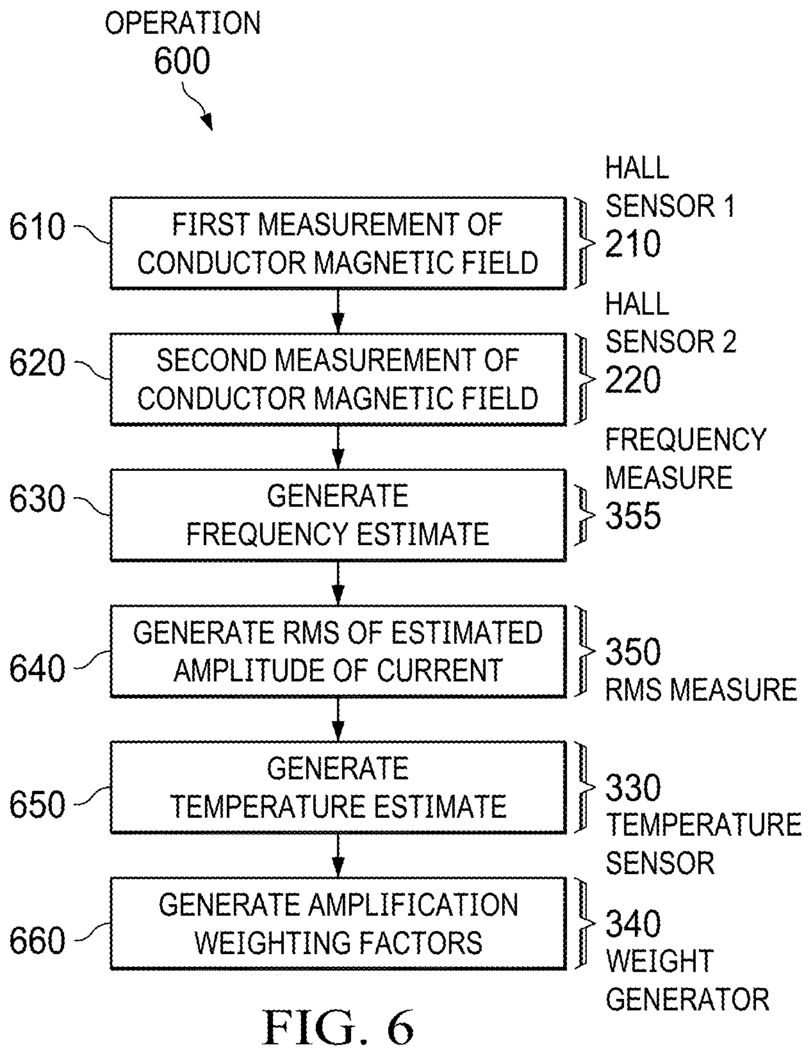
FIG. 6 illustrates a methodology for current sensing by the current sensor package of FIG. 2, in an example.

FIG. 6 illustrates a methodology 600 for current sensing by the current sensor package of FIG. 2. As shown, example method 600 includes a number of phases and sub-processes, the sequence of which may vary from one embodiment to another. However, when considered in aggregate, these phases and sub-processes form a process for sensing current in a conductor, in certain of the embodiments described herein, such as illustrated in FIGS. 1-5, as described above. However, other system architectures can be used in other embodiments. Accordingly, the correlation of the various functions shown in FIG. 6 to the specific components illustrated in the drawings does not imply any structural and/or use limitations. Instead, other embodiments may include varying degrees of integration, in which multiple functions are effectively performed by one system.

In one embodiment, the process begins at operation 610, by generating a first measurement signal of a magnetic field generated by a conductor.

At operation 620, a second measurement signal of the magnetic field generated by the conductor is obtained. In some embodiments, the second measurement signal measures the magnetic field in a direction that is orthogonal to the direction that is measured by the first measurement signal.

At operation 630, the frequency of the current in the conductor is estimated.

At operation 640, the RMS value of an estimated amplitude of the current in the conductor is calculated.

At operation 650, a temperature estimate is obtained for the IC configured to perform the method.

At operation 660, a first weighting factor and a second weighting factor are generated based on the frequency estimate, the RMS value, and the temperature estimate. The first weighting factor is used to control amplification of the first measurement signal and the second weighting factor is used to control amplification of the second measurement signal. The estimated amplitude of the current in the conductor is based on a sum of the amplified first measurement signal and the amplified second measurement signal.

In some embodiments, weighting factors may be precalculated, for example during a calibration process as described below. The weighting factors may be based on coupling coefficients that provide an estimate of coupling between the conductor and other conductors that are in relatively close proximity.

In some embodiments, additional sensors may be employed, and additional weighting factors may be generated to scale the measurements from those sensors.

Figure 7:
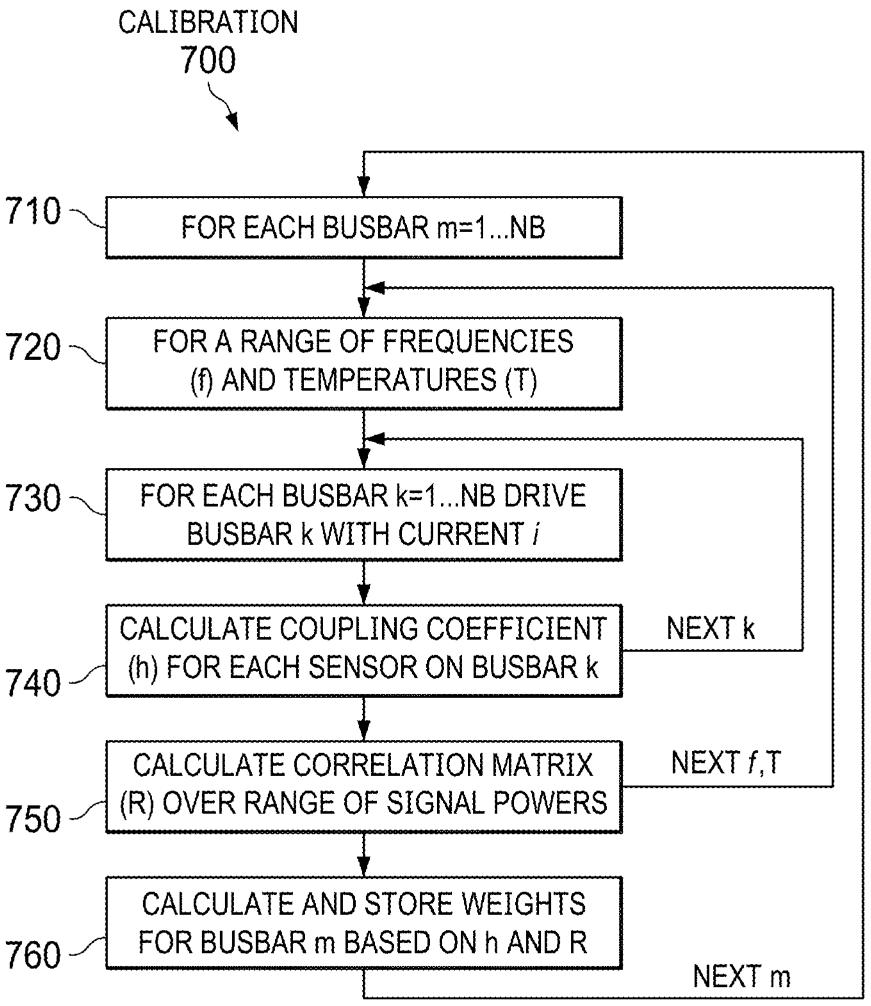
FIG. 7 illustrates a methodology for calibrating the current sensor package of FIG. 2, in an example.

FIG. 7 illustrates a methodology 700 for calibrating the current sensor package of FIG. 2. As shown, example method 700 includes a number of phases and sub-processes, the sequence of which may vary from one embodiment to another. However, when considered in aggregate, these phases and sub-processes form a process for calibrating the current sensor package, in certain of the embodiments described herein, such as illustrated in FIGS. 1-5, as described above. However, other system architectures can be used in other embodiments. Accordingly, the correlation of the various functions shown in FIG. 7 to the specific components illustrated in the drawings does not imply any structural and/or use limitations. Instead, other embodiments may include varying degrees of integration, in which multiple functions are effectively performed by one system.

In one embodiment, the process begins at operation 710, by selecting a first busbar, m, from among NB busbars, for calibration.

At operation 720, a frequency, f, is selected from a range of frequencies of interest and a temperature, T is selected from a range of temperatures of interest.

At operation 730 a selected busbar, k, is driven with a current, i, at frequency f and at temperature T, while the other busbars are undriven (e.g., substantially no current flowing through those busbars).

At operation 740, coupling coefficients are calculated for each sensor on busbar k by taking N sensor measurements from each sensor on busbar k, at the selected frequency and temperature. In some embodiments, the calculation may be expressed as:

$$h_k(,T)=\mathrm{FFT}(S_k,N,f)/\mathrm{FFT}(i,N,f)$$

where i comprises N samples of the driving current on busbar k, $S_k$ is a vector of N sensor readings for each sensor on busbar k, and $h_k$ is a vector of coupling coefficients for busbar k at frequency f and temperature T, and FFT is a fast Fourier transform. The length of vectors $S_k$ and $h_k$ is the number of sensors.

The process repeats back to operation 730 with a next selected busbar k until $h_k$ has been calculated for all busbars k=1 through NB.

At operation 750, a correlation matrix R is calculated based on $h_k$, over a range of signal powers of interest. In some embodiments, the calculation of R (e.g., for the case of three busbars) may be expressed as:

$$R(f,T)=\sigma_s^2h_1(f,T)h_1(f,T)^H+\sigma_s^2h_2(f,T)h_2(f,T)^H+\sigma_s^2h_3(f,T)h_3(f,T)^H+\sigma_v^2I \quad \text{(equ 1)}$$

where $$\sigma_s^2$$

is a selected signal power in the range of interest and $$\sigma_v^2$$

is the sensor noise power which is known or otherwise predetermined by any suitable means. In this formula, H represents the conjugate transpose operator, and I is the identity matrix. In this example, R is mathematically derived based on a minimum variance distortionless response cost function. In some embodiments, the calculation of R (e.g., for the first of three busbars) may be simplified to:

$$R(f,T)=\sigma_s^2h_2(f,T)h_2(f,T)^H+\sigma_s^2h_3(f,T)h_3(f,T)^H+\sigma_v^2I \quad \text{(equ 2)}$$

in which case, R is derived based on a cost function to maximize signal to interference plus noise ratio. The calculation of R for additional busbars follows similarly. For example, for the second busbar:

$$R(f,T)=\sigma_s^2 h_1(f,T)h_1(f,T)^H+\sigma_s^2 h_3(f,T)h_3(f,T)^H+\sigma_v^2 I \quad \text{(equ 3)}$$

and for the third busbar:

$$R(f,T)=\sigma_s^2 h_1(f,T)h_1(f,T)^H+\sigma_s^2 h_2(f,T)h_2(f,T)^H+\sigma_v^2 I \quad \text{(equ 4)}$$

At operation 760, weighting factors for busbar m are calculated based on $h_k$ and R. In some embodiments, the calculation of w for busbar 1 may be expressed as $$w_1(f,T)=\mathrm{Real}\left[\frac{1}{h_1(f,T)^H R^{-1}(f,T)h_1(f,T)}R^{-1}(f,T)h_1(f,T)\right]$$

where R is given by equation (2) or equation (1).

The calculation of w for busbar 2 may be expressed as $$w_2(f,T)=\mathrm{Real}\left[\frac{1}{h_2(f,T)^H R^{-1}(f,T)h_2(f,T)}R^{-1}(f,T)h_2(f,T)\right]$$

where R is given by equation (3) or equation (1).

The calculation of w for busbar 3 may be expressed as $$w_3(f,T)=\mathrm{Real}\left[\frac{1}{h_3(f,T)^H R^{-1}(f,T)h_3(f,T)}R^{-1}(f,T)h_3(f,T)\right]$$

where R is given by equation (4) or equation (1).

The weighting factor may then be stored in a lookup table or other suitable memory and may be indexed or addressed by parameters m, f, T, and $$\sigma_s^2.$$

The process then repeats back to operation 720 with a next selected frequency and temperature until all frequencies and temperatures of interest have been calibrated. The process then continues back to operation 710 for the next busbar m until all busbars have been calibrated.

Figure 8:
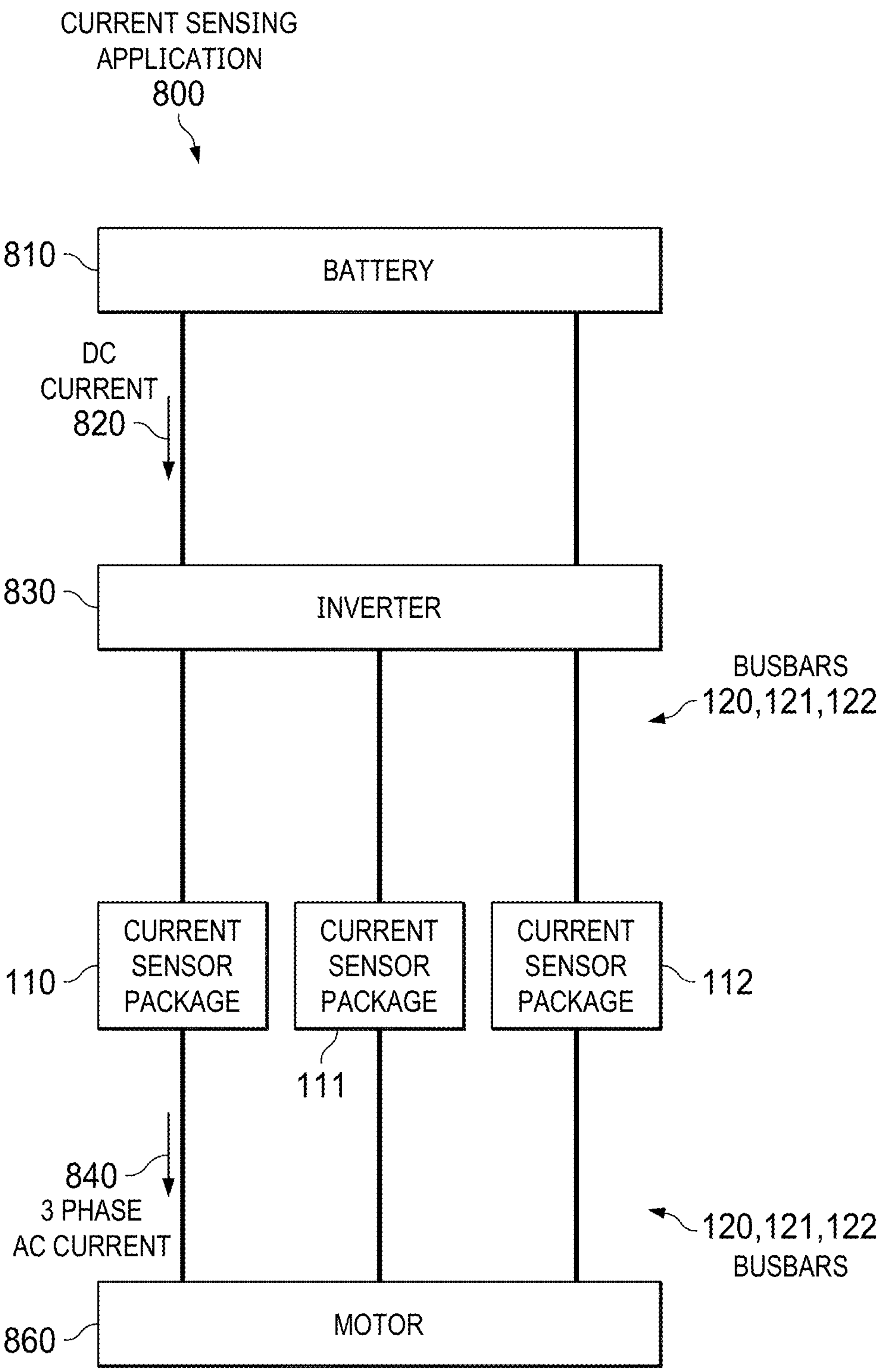
FIG. 8 illustrates an example application of the current sensor package of FIG. 2, in an example.

FIG. 8 illustrates one example application 800 of the of the current sensor packages 110, 111, and 112 of FIG. 2. The illustrated example is a traction inverter as might be used, for example, to drive a motor in an electric vehicle. The traction inverter 830 is configured to convert DC current 820, provided by battery 810, to three phase AC current 840 to be delivered to motor 860 on busbars 120, 121, and 122. In an application such as this, it can be important to monitor the amplitude of the current on each phase, for example to make any necessary adjustments for efficient operation of the motor. Current sensor packages 110, 111, and 112 are deployed on bus bars 120, 121, and 122, as described above, to provide current monitoring of the associated busbar with improved accuracy compared to existing techniques by reducing interference from other busbars. In some embodiments, the current estimations generated by the current sensor packages may be provided to a controller (not shown) that is configured to control the inverter, the motor, or other systems of the application (e.g., the electric vehicle).

FURTHER EXAMPLES

Example 1 is an integrated circuit (IC), including: a first sensor configured to generate a first magnetic field measurement; a second sensor configured to generate a second magnetic field measurement; and a weight generation circuit configured to generate a first weighting factor and a second weighting factor based on calibrated coupling coefficients, the first weighting factor to control amplification of the first magnetic field measurement and the second weighting factor to control amplification of the second magnetic field measurement.

Example 2 includes the integrated circuit of Example 1, wherein the first magnetic field measurement provides a first measurement signal of a magnetic field generated by a first conductor, the second magnetic field measurement provides a second measurement signal of the magnetic field generated by the first conductor, and the calibrated coupling coefficients provide an estimate of coupling between the first conductor and a second conductor.

Example 3 includes the integrated circuit of Example 2, and further includes: a frequency measurement circuit configured to generate a frequency estimate of a current in the first conductor; a root-mean-square (RMS) measurement circuit configured to generate an RMS value of an estimated amplitude of the current in the first conductor; and a temperature measurement circuit configured to generate a temperature estimate of the IC; wherein the weight generation circuit is further configured to generate the first weighting factor and the second weighting factor based on the frequency estimate, the RMS value, and the temperature estimate.

Example 4 includes the integrated circuit of Examples 2 or 3, wherein the estimated amplitude of the current in the first conductor is based on a sum of the amplified first magnetic field measurement and the amplified second magnetic field measurement.

Example 5 includes the integrated circuit of any one of Examples 2 through 4, wherein the first sensor is a Hall effect sensor configured to measure a first directional component of the magnetic field and the second sensor is a Hall effect sensor configured to measure a second directional component of the magnetic field, wherein the second directional component is orthogonal to the first directional component.

Example 6 includes the integrated circuit of any one of Examples 2 through 5, and further includes: a first analog front end (AFE) circuit configured to amplify the first measurement signal based on the first weighting factor; and a second AFE circuit configured to amplify the second measurement signal based on the second weighting factor.

Example 7 includes the integrated circuit of any one of Examples 2 through 6, and further includes: a first analog to digital converter (ADC) configured to convert the first measurement signal to a first digital signal; a second ADC configured to convert the second measurement signal to a second digital signal; a first multiplier configured to multiply the first digital signal by the first weighting factor; and a second multiplier configured to multiply the second digital signal by the second weighting factor.

Example 8 is a current sensor package including the IC of Example 2, wherein the IC is a first IC and the current sensor package further including a second IC, the second IC including: a third sensor configured to generate a third measurement signal of the magnetic field generated by the first conductor; a fourth sensor configured to generate a fourth measurement signal of the magnetic field generated by the first conductor; and the weight generation circuit is configured to generate a third weighting factor and a fourth weighting factor based on the calibrated coupling coefficients, the third weighting factor to control amplification of the third measurement signal and the fourth weighting factor to control amplification of the fourth measurement signal, wherein the estimated amplitude of the current in the first conductor is based on a sum of the amplified first measurement signal, the amplified second measurement signal, the amplified third measurement signal and the amplified fourth measurement signal.

Example 9 is a method for current sensing. The method includes: generating a first magnetic field measurement; generating a second magnetic field measurement; generating a frequency estimate of a current; calculating a root-mean-square (RMS) value of an estimated amplitude of the current; generating a temperature estimate of an integrated circuit (IC) configured to perform the method; and generating a first weighting factor and a second weighting factor based on the frequency estimate, the RMS value, and the temperature estimate, the first weighting factor to control amplification of the first magnetic field measurement and the second weighting factor to control amplification of the second magnetic field measurement.

Example 10 includes the method of Example 9, wherein the first magnetic field measurement provides a first measurement signal of a magnetic field generated by a conductor and the second magnetic field measurement provides a second measurement signal of the magnetic field generated by the conductor.

Example 11 includes the method of Example 10, further including estimating the amplitude of the current in the conductor based on a sum of the amplified first measurement signal and the amplified second measurement signal.

Example 12 includes the method of Examples 10 or 11, wherein the first measurement signal is provided by a first Hall effect sensor configured to measure a first directional component of the magnetic field and the second measurement signal is provided by a second Hall effect sensor configured to measure a second directional component of the magnetic field, wherein the second directional component is orthogonal to the first directional component.

Example 13 includes the method of any one of Examples 10 through 12, wherein the conductor is a first conductor and the method further includes precalculating the first weighting factor and the second weighting factor based on calibrated coupling coefficients that provide an estimate of coupling between the first conductor and a second conductor.

Example 14 includes the method of any one of Examples 10 through 13, further including: providing the first weighting factor to a first analog front end (AFE) circuit configured to amplify the first measurement signal based on the first weighting factor; and providing the second weighting factor to a second AFE circuit configured to amplify the second measurement signal based on the second weighting factor.

Example 15 includes the method of any one of Examples 10 through 14, further including: converting the first measurement signal to a first digital signal; converting the second measurement signal to a second digital signal; multiplying the first digital signal by the first weighting factor; and multiplying the second digital signal by the second weighting factor.

Example 16 is a traction inverter system including: an inverter circuit configured to convert direct current into a first alternating current phase, delivered on a first busbar, and a second alternating current phase, delivered on a second busbar; and a current sensor package configured to estimate amplitude of the first alternating current phase in the first busbar, the current sensor package disposed on the first busbar and including an integrated circuit (IC), the IC including: a first sensor configured to generate a first measurement signal of a magnetic field generated by the first busbar; a second sensor configured to generate a second measurement signal of the magnetic field generated by the first busbar; and a weight generation circuit configured to generate a first weighting factor and a second weighting factor based on calibrated coupling coefficients, the first weighting factor to control amplification of the first measurement signal and the second weighting factor to control amplification of the second measurement signal.

Example 17 includes the traction inverter system of Example 16, further including: a frequency measurement circuit configured to generate a frequency estimate of the first alternating current phase in the first busbar; a root-mean-square (RMS) calculation circuit configured to calculate an RMS value of the estimated amplitude of the first alternating current phase in the first busbar; and a temperature measurement circuit configured to generate a temperature estimate of the IC; wherein the weight generation circuit is further configured to generate the first weighting factor and the second weighting factor based on the frequency estimate, the RMS value, and the temperature estimate.

Example 18 includes the traction inverter system of Examples 16 or 17, wherein the estimated amplitude of the first alternating current phase in the first busbar is based on a sum of the amplified first measurement signal and the amplified second measurement signal.

Example 19 includes the traction inverter system of any of Examples 16 through 18, wherein the first sensor is a Hall effect sensor configured to measure a first directional component of the magnetic field and the second sensor is a Hall effect sensor configured to measure a second directional component of the magnetic field, wherein the second directional component is orthogonal to the first directional component.

Example 20 includes the traction inverter system of any of Examples 16 through 19, wherein the IC is a first IC and the current sensor package includes a second IC, the second IC including: a third sensor configured to generate a third measurement signal of the magnetic field generated by the first busbar; a fourth sensor configured to generate a fourth measurement signal of the magnetic field generated by the first busbar; and the weight generation circuit is configured to generate a third weighting factor and a fourth weighting factor based on the calibrated coupling coefficients, the third weighting factor to control amplification of the third measurement signal and the fourth weighting factor to control amplification of the fourth measurement signal, wherein the estimated amplitude of the first alternating current phase in the first busbar is based on a sum of the amplified first measurement signal, the amplified second measurement signal, the amplified third measurement signal and the amplified fourth measurement signal.

Example 21 includes the traction inverter system of any of Examples 16 through 20, further including: a first analog front end (AFE) circuit configured to amplify the first measurement signal based on the first weighting factor; and a second AFE circuit configured to amplify the second measurement signal based on the second weighting factor.

Example 22 includes the traction inverter system of any of Examples 16 through 21, further including: a first analog to digital converter (ADC) configured to convert the first measurement signal to a first digital signal; a second ADC configured to convert the second measurement signal to a second digital signal; a first multiplier configured to multiply the first digital signal by the first weighting factor; and a second multiplier configured to multiply the second digital signal by the second weighting factor.

Example 23 includes the traction inverter system of any of Examples 16 through 22, wherein the current sensor package is a first current sensor package and the traction inverter system further includes a second current sensor package configured to estimate amplitude of the second alternating current phase in the second busbar, the second current sensor package disposed on the second busbar.

Example 24 is a device, including: a first sensor having a first output; a second sensor having a second output; a first analog front end (AFE) circuit having a first input, a second input, and a third output, the first input coupled to the first output; a second AFE circuit having a third input, a fourth input, and a fourth output, the third input coupled to the second output; and a weight generation circuit having a fifth input, a sixth input, a seventh input, a fifth output, and a sixth output, the fifth output coupled to the second input of the first AFE to provide a first amplification weighting factor, the sixth output coupled to the fourth input of the second AFE to provide a second amplification weighting factor; wherein the first amplification weighting factor and the second amplification weighting factor are based on the fifth input, the sixth input, and the seventh input, the fifth input providing a frequency measurement of an estimated current flow, the sixth input providing a root-mean-square (RMS) value of the estimated current flow, and the seventh input providing a temperature of the device.

Example 25 includes the device of Example 24, wherein the first sensor is disposed on a conductor, the second sensor is disposed on the conductor, and the estimated current flow is an estimate of the current flow through the conductor.

Example 26 includes the device of Example 25, further including a summing amplifier having an eighth input, a ninth input, and a tenth output, the eighth input coupled to the third output, the ninth input coupled to the fourth output, wherein the tenth output provides the estimated current flow through the conductor.

Example 27 includes the device of Example 26, further including: a frequency measurement circuit having a tenth input and a seventh output, the tenth input coupled to the tenth output, the seventh output coupled to the fifth input of the weight generation circuit; an RMS measurement circuit having an eleventh input and an eighth output, the eleventh input coupled to the tenth output, the eighth output coupled to the sixth input of the weight generation circuit; and a temperature measurement circuit having a ninth output, the ninth input coupled to the seventh input of the weight generation circuit.

Example 28 includes the device of any of Examples 25 through 27, wherein the first sensor is a Hall effect sensor configured to measure a first directional component of a magnetic field generated by a conductor and the second sensor is a Hall effect sensor configured to measure a second directional component of the magnetic field, wherein the second directional component is orthogonal to the first directional component.

Example 29 includes the device of any of Examples 25 through 28, wherein the conductor is a first conductor and the first amplification weighting factor and the second amplification weighting factor are precalculated based on calibrated coupling coefficients that provide an estimate of coupling between the first conductor and a second conductor.

Example 30 includes the device of any of Examples 25 through 29, wherein each of the first AFE and the second AFE includes an amplifier circuit.

Example 31 is an integrated circuit package that includes the device of Example 24.

Example 32 is a printed circuit board that includes the device of Example 24 or the integrated circuit package of Example 31.

In this description, the term "couple" may cover connections, communications, or signal paths that enable a functional relationship consistent with this description. For example, if device A generates a signal to control device B to perform an action: (a) in a first example, device A is coupled to device B by direct connection; or (b) in a second example, device A is coupled to device B through intervening component C if intervening component C does not alter the functional relationship between device A and device B, such that device B is controlled by device A via the control signal generated by device A.

A device that is "configured to" perform a task or function may be configured (e.g., programmed and/or hardwired) at a time of manufacturing by a manufacturer to perform the function and/or may be configurable (or reconfigurable) by a user after manufacturing to perform the function and/or other additional or alternative functions. The configuring may be through firmware and/or software programming of the device, through a construction and/or layout of hardware components and interconnections of the device, or a combination thereof.

As used herein, the terms "terminal," "node," "interconnection," "pin," and "lead" are used interchangeably. Unless specifically stated to the contrary, these terms are generally used to mean an interconnection between or a terminus of a device element, a circuit element, an integrated circuit, a device or other electronics or semiconductor component.

A circuit or device that is described herein as including certain components may instead be adapted to be coupled to those components to form the described circuitry or device. For example, a structure described as including one or more semiconductor elements (such as transistors), one or more passive elements (such as resistors, capacitors, and/or inductors), and/or one or more sources (such as voltage and/or current sources) may instead include only the semiconductor elements within a single physical device (e.g., a semiconductor die and/or integrated circuit (IC) package) and may be adapted to be coupled to at least some of the passive elements and/or the sources to form the described structure either at a time of manufacture or after a time of manufacture, such as by an end user and/or a third party.

Circuits described herein are reconfigurable to include additional or different components to provide functionality at least partially similar to functionality available prior to the component replacement. Components shown as resistors, unless otherwise stated, are generally representative of any one or more elements coupled in series and/or parallel to provide an amount of impedance represented by the resistor shown. For example, a resistor or capacitor shown and described herein as a single component may instead be multiple resistors or capacitors, respectively, coupled in parallel between the same nodes. For example, a resistor or capacitor shown and described herein as a single component may instead be multiple resistors or capacitors, respectively, coupled in series between the same two nodes as the single resistor or capacitor.

In this description, unless otherwise stated, "about," "approximately," or "substantially" preceding a parameter means being within +/−10 percent of that parameter.

Modifications are possible in the described embodiments, and other embodiments are possible, within the scope of the claims.

What is claimed is:

1. An apparatus, comprising an integrated circuit package, wherein: the integrated circuit package includes a first die and a second die;

the first die includes:

a first magnetic field sensor configured to provide a first signal based on sensing a first magnetic field in a first direction; and a second magnetic field sensor configured to provide a second signal based on sensing a second magnetic field in a second direction the second die includes:

a third magnetic field sensor configured to provide a third signal based on sensing a third magnetic field in the first direction; and a fourth magnetic field sensor configured to provide a fourth signal based on sensing a fourth magnetic field in the second direction; and the apparatus includes a processing circuit on at least one of the first die or the second die, the processing circuit configured to determine a magnitude of a current based on the first, second, third, and fourth signals.

2. The apparatus of claim 1, wherein the processing circuit includes:

a first analog front end (AFE) having a first AFE input, a first AFE output, and a first AFE control input, the first AFE input coupled to the first magnetic field sensor;

a second AFE having a second AFE input, a second AFE output, and a second AFE control input, the second AFE input coupled to the second magnetic field sensor;

a summing amplifier having a first amplifier input, a second amplifier input, and a summing output, the first amplifier input coupled to the first AFE output, and the second amplifier input coupled to the second AFE output; and a weight generator having a first weight output, a second weight output, and a weight control input, the first weight output coupled to the first AFE control input, the second weight output coupled to the second AFE control input, and the summing output coupled to the weight control input.

3. The apparatus of claim 2, wherein the weight control input is a first weight control input, the weight generator has a second weight control input and a third weight control input, and the processing circuit further comprises:

a frequency measurement circuit coupled between the summing output and the first weight control input;

a root-mean-square (RMS) measurement circuit coupled between the summing output and the second weight control input; and a temperature measurement circuit coupled to the third weight control input.

4. The apparatus of claim 1, wherein the processing circuit includes:

a first analog-to-digital converter (ADC) having a first ADC input and a first ADC output, the first ADC input coupled to the first magnetic field sensor;

a second ADC having a second ADC input and a second ADC output, the second ADC input coupled to the second magnetic field sensor;

a first multiplication circuit having a first multiplication input, a second multiplication input, and a first multiplication output, the first multiplication input coupled to the first ADC output;

a second multiplication circuit having a third multiplication input, a fourth multiplication input, and a second multiplication output, the third multiplication input coupled to the second ADC output;

a summing circuit having a first summing input, a second summing input, and a summing output, the first summing input coupled to the first multiplication output, and the second summing input coupled to the second multiplication output; and a weight generator having a first weight output, a second weight output, and a weight control input, the first weight output coupled to the second multiplication input, the second weight output coupled to the fourth multiplication input, and the summing output coupled to the weight control input.

5. The apparatus of claim 4, wherein the processing circuit further includes:

a first AFE coupled between the first magnetic field sensor and the first ADC input; and a second AFE coupled between the second magnetic field sensor and the second ADC input.

6. The IC of claim 2, further comprising:

a first analog front end (AFE) circuit configured to amplify the first measurement signal based on the first weighting factor; and a second AFE circuit configured to amplify the second measurement signal based on the second weighting factor.

7. The apparatus of claim 2, wherein the summing amplifier is a first summing amplifier, the summing output is a first summing output, and the apparatus further comprises a second summing amplifier having a third amplifier input, a fourth amplifier input, and a second summing output, the third amplifier input coupled to the first summing output, and the weight control input is coupled to the second summing output.

8. The apparatus of claim 7, wherein the weight generator is a first weight generator; and wherein the processing circuit further includes:

a third AFE having a third AFE input, a third AFE output, and a third AFE control input, the third AFE input coupled to the third magnetic field sensor;

a fourth AFE having a fourth AFE input, a fourth AFE output, and a fourth AFE control input, the fourth AFE input coupled to the fourth magnetic field sensor;

a third summing amplifier having a fifth amplifier input, a sixth amplifier input, and a third summing output, the fifth amplifier input coupled to the third AFE output, the sixth amplifier input coupled to the fourth AFE output, and the third summing output coupled to the fourth amplifier input; and a second weight generator coupled to the first weight generator and having a third weight output, and a fourth weight output, the third weight output coupled to the third AFE control input, and the fourth weight output coupled to the fourth AFE control input.

9. The apparatus of claim 3, wherein the weight generator is configured to:

receive an amplitude of the current from the RMS measurement circuit;

receive a frequency of the current from the frequency measurement circuit;

receive a temperature measurement from the temperature measurement circuit; and determine coupling coefficients between two conductors based on the amplitude, the frequency, and the temperature measurement.

10. The apparatus of claim 8, wherein the first AFE, the second AFE, the first and second summing amplifiers, and the first weight generator are part of the first die; and wherein the third AFE, the fourth AFE, the third summing amplifier, and the second weight generator are part of the second die.

11. The apparatus of claim 4, wherein the summing circuit has a third summing input and a fourth summing input, the weight generator has a third weight output and a fourth weight output, and the processing circuit further comprises:

a third ADC coupled to the third magnetic field sensor;

a fourth ADC coupled to the fourth magnetic field sensor;

a third multiplication circuit having a fifth multiplication input, a sixth multiplication input, and a third multiplication output, the fifth multiplication input coupled to the third ADC, the sixth multiplication input coupled to the third weight output, and the third multiplication output coupled to the third summing input; and a fourth multiplication circuit having a seventh multiplication input, an eighth multiplication input, and a fourth multiplication output, the seventh multiplication input coupled to the fourth ADC, the eighth multiplication input coupled to the fourth weight output, and the fourth multiplication output coupled to the fourth summing input.

12. The apparatus of claim 1, wherein the first direction is orthogonal to the second direction.

13. The apparatus of claim 11, wherein the first and second ADCs, the first, second, third, and fourth multiplication circuits, the summing circuit, and the weight generator are part of the first die; and wherein the third and fourth ADCs are part of the second die.

14. The apparatus of claim 11, wherein the first, second, third, and fourth ADCs, the first, second, third, and fourth multiplication circuits, the summing circuit, and the weight generator are part of the first die.

15. The apparatus of claim 4, wherein:

the weight control input is a first weight control input;

the weight generator has a second weight control input and a third weight control input; and the processing circuit further comprises:

a frequency measurement circuit coupled between the summing output and the first weight control input;

an RMS measurement circuit coupled between the summing output and the second weight control input; and a temperature measurement circuit coupled to the third weight control input.

16. A method for current sensing, the method comprising:

receiving a first signal from a first magnetic field sensor on a first die of a packaged integrated circuit (IC), the first signal representing a measurement of a first magnetic field in a first direction;

receiving a second signal from a second magnetic field sensor on the first die of the packaged IC, the second signal representing a measurement of a second magnetic field in a second direction;

receiving a third signal from a third magnetic field sensor on a second die of the packaged IC, the third signal representing a measurement of a third magnetic field in the first direction;

receiving a fourth signal from a fourth magnetic field sensor on the second die of the packaged IC, the fourth signal representing a measurement of a fourth magnetic field in the second direction;

generating a fifth signal based on the first, second, third, and fourth signals; and generating a measurement of a current based on the fifth signal.

17. The method of claim 16, wherein generating the fifth signal comprises:

generating a first weighing factor for the first magnetic field sensor;

generating a second weighing factor for the second magnetic field sensor;

scaling the first signal based on the first weighing factor;

scaling the second signal based on the second weighing factor; and generating the fifth signal based on at least the scaled first signal and the scaled second signal.

18. The method of claim 17, further comprising:

receiving a temperature measurement;

generating a frequency estimate of the current based on a prior fifth signal; and generating a root-mean-square (RMS) value of an amplitude of the current based on the prior fifth signal, wherein generating the first weighing factor for the first magnetic field sensor includes generating the first weighing factor based on the temperature measurement, the frequency estimate, and the RMS value; and wherein generating the second weighing factor for the second magnetic field sensor includes generating the second weighing factor based on the temperature measurement, the frequency estimate, and the RMS value.

19. The method of claim 17, wherein the current is in a first conductor, and the method comprises:

determining coupling coefficients between the first conductor and a second conductor;

generating the first weighing factor based on the coupling coefficients; and generating the second weighing factor based on the coupling coefficients.

20. The method of claim 19, further comprising:

determining an amplitude of the current;

determining a frequency of the current; and receiving a temperature measurement, wherein determining the coupling coefficients between the first conductor and the second conductor includes determining the coupling coefficients based on the amplitude, the frequency, and the temperature measurement.

21. The method of claim 16, wherein the first direction is orthogonal to the second direction.

22. An apparatus comprising:

a first magnetic field sensor having a first sensor output;

a second magnetic field sensor having a second sensor output;

a first analog front end (AFE) having a first AFE input, a first AFE output, and a first AFE control input, the first AFE input coupled to the first sensor output;

a second AFE having a second AFE input, a second AFE output, and a second AFE control input, the second AFE input coupled to the second sensor output;

a summing amplifier having a first amplifier input, a second amplifier input, and a summing output, the first amplifier input coupled to the first AFE output, the second amplifier input coupled to the second AFE output, and the summing output coupled to a current measurement output; and a weight generator having a first weight output, a second weight output, and a weight control input, the first weight output coupled to the first AFE control input, the second weight output coupled to the second AFE control input, and the summing output coupled to the weight control input.

23. An apparatus comprising:

a first magnetic field sensor having a first sensor output;

a second magnetic field sensor having a second sensor output;

a first analog-to-digital converter (ADC) having a first ADC input and a first ADC output, the first ADC input coupled to the first sensor output;

a second ADC having a second ADC input and a second ADC output, the second ADC input coupled to the second sensor output;

a first multiplication circuit having a first multiplication input, a second multiplication input, and a first multiplication output, the first multiplication input coupled to the first ADC output;

a second multiplication circuit having a third multiplication input, a fourth multiplication input, and a second multiplication output, the third multiplication input coupled to the second ADC output;

a summing circuit having a first summing input, a second summing input, and a summing output, the first summing input coupled to the first multiplication output, the second summing input coupled to the second multiplication output, and the summing output coupled to a current measurement output; and a weight generator having a first weight output, a second weight output, and a weight control input, the first weight output coupled to the second multiplication input, the second weight output coupled to the fourth multiplication input, and the summing output coupled to the weight control input.

* * * * *